(12) United States Patent
Nakagawa et al.

(10) Patent No.: US 6,342,680 B1
(45) Date of Patent: *Jan. 29, 2002

(54) CONDUCTIVE PLASTIC WITH LEAD-FREE SOLDER ADDITIVE

(75) Inventors: Takeo Nakagawa, Kawasaki; Hiroyuki Noguchi, Chiba, both of (JP)

(73) Assignee: Japan Science and Technology Corporation (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/027,214

(22) Filed: Feb. 20, 1998

(30) Foreign Application Priority Data

Feb. 28, 1997 (JP) ............................................. 9-045145

(51) Int. Cl.⁷ .................................................. H05K 1/09
(52) U.S. Cl. ........................ 174/257; 174/256; 428/901; 428/344; 428/458
(58) Field of Search ................................. 174/250, 256, 174/257; 428/344, 458, 901

(56) References Cited

U.S. PATENT DOCUMENTS

| | | | | |
|---|---|---|---|---|
| 3,978,378 A | * | 8/1976 | Tigner et al. | 361/323 |
| 4,582,872 A | * | 4/1986 | Hudgin et al. | 524/439 |
| 5,062,896 A | * | 11/1991 | Huang et al. | 106/287.19 |
| 5,538,789 A | * | 7/1996 | Capote et al. | 428/344 |

* cited by examiner

*Primary Examiner*—K. Cuneo
(74) *Attorney, Agent, or Firm*—Lorusso & Loud

(57) ABSTRACT

A lead-free super-highly conductive plastic is formed of a conductive resin composition which includes a thermoplastic resin, a lead-free solder that melts during plasticization, and metal powder or a mixture of metal powder and metal short fibers that promotes the fine dispersion of particles of the lead-free solder within the thermoplastic resin. In the lead-free super-highly conductive plastic, since particles of the lead-free solder are connected with each other via solder melted within the plastic, the particles of the lead-free solder are mutually joined, so that high conductivity is attained.

8 Claims, 4 Drawing Sheets

CONDUCTIVE PLASTIC WITH LEAD-FREE SOLDER ADDITIVE

BACKGROUND OF THE INVENTION

1. Field of the Invention

The present invention relates to a technique for manufacturing a conductive resin composition having a low electrical resistance, in which techniques a resin and a metal (lead-free solder) in a semi-melted state are kneaded to cause particles of the metal to disperse finely within the resin and to come into connection with one another in order to reduce the electrical resistance. The semi-melted state may be attained artificially through addition of unmeltable metal powder into a completely melted metal.

2. Description of the Related Art

Conventionally, conductive plastics have been manufactured through incorporation of metal fibers into a resin. Further, in order to improve the reliability of the conductive plastics, a metal having a low melting point has been added into the metal fibers to reduce the contact resistance. Such conductive plastics have been utilized as highly conductive plastics in various applications, such as electromagnetic wave shields.

However, since the conventional conductive plastics have a high volumetric resistivity of $10^{-3}\Omega\cdot cm$ or greater, they generate heat when electricity flows therethrough, resulting in melting of the conductive plastics and increased resistance. Therefore, the conventional conductive plastics cannot be used for transmitting electricity.

Further, when the metal filler content is increased to reduce the volumetric resistivity, the moldability deteriorates, rendering injection molding impossible. In addition, when a solder containing lead—which is hazardous material—is used, waste conductive plastics cause an environmental problem.

There has also been utilized a technique called MID (Molded Interconnect Device). In this technique, injection molding is conducted two times, and in the first injection molding, there is used a resin that has been subjected to a process for facilitating plating thereon. The thus-injected molded member is plated to form a metallic film on the surface thereof.

However, this technique requires a plating process. In addition, since electrically conductive circuits are formed through plating, the circuits cannot be formed within the resin.

As described above, in order to improve the conductivity of the conductive plastics, the metallic component must be mixed into the resin in a larger amount. However, when a fibrous material is mixed in the resin in a large amount, the moldability of the resin deteriorates, resulting in clogging of a nozzle, or impossibility of injection molding into a narrow-width shape. In addition, when a large amount of metal powder is mixed in the resin to establish connection between particles of the metal to thereby attain conductivity, the metal powder must be mixed in an amount of 60 vol. % or greater. In this case as well, the moldability deteriorates, and the attained conductivity is low. Further, since there is a difference between the resin and the metallic component in terms of thermal expansion, when the temperature increases, the number of contacts between the metal particles decreases due to expansion of the resin, resulting in deterioration in conductivity.

Moreover, there has been developed a conductive plastic to which is added a small amount of eutectic crystal solder—which is a metal having a low melting point. However, since the eutectic crystal solder contains lead, waste of the conductive plastic adversely affects the environment.

Also, the above-described MID technique also has the drawbacks of necessity of a plating process and the impossibility of forming conductive circuits within resin, the latter stemming from the fact that the resin itself does not have conductivity.

SUMMARY OF THE INVENTION

An object of the present invention is to solve the above-mentioned problems and to provide a super highly conductive plastic whose conductivity does not decrease in various environments and which is therefore highly reliable.

Another object of the present invention is to provide conductive circuits formed of the conductive plastic.

Still another object of the present invention is to provide a method of forming conductive circuits through use of the conductive plastic.

To achieve the first object, the present invention provides a conductive plastic formed of a conductive resin composition which comprises a thermoplastic resin, a lead-free solder that melts during plasticization, and metal powder or a mixture of metal powder and metal short fibers that assists the fine dispersion of particles of the lead-free solder within the thermoplastic resin.

Preferably, particles of the lead-free solder are dispersed such that the particles of the lead-free solder are in unbroken connection throughout the thermoplastic resin.

Preferably, the conductive resin composition has a volumetric resistivity of $10^{-3}\Omega\cdot cm$ or less.

To achieve the second object, the present invention provides a conductive circuit including a wiring path that is formed in an insulating member through injection molding of a conductive resin composition which comprises a thermoplastic resin, a lead-free solder that melts during plasticization, and metal powder or a mixture of metal powder and metal short fibers that assists the fine dispersion of particles of the lead-free solder within the thermoplastic resin.

The wiring path may be formed for establishing connection between parts, for connection with a mounted component, or for connection with an electronic part.

To achieve the third object, the present invention provides a method of forming a conductive circuit in which a wiring path is formed in an insulating member through injection molding of a conductive resin composition which comprises a thermoplastic resin, a lead-free solder that melts during plasticization, and metal powder or a mixture of metal powder and metal short fibers that assists the fine dispersion of particles of the lead-free solder within the thermoplastic resin.

The wiring path may be formed for establishing connection between parts, for connection with a mounted component, or for connection with an electronic part.

The present invention also provides a method of forming a conductive circuit, the method comprising the steps of forming a frame having a space corresponding to a predetermined designed wiring path; and injecting into the space of the frame a conductive resin composition which comprises a thermoplastic resin, a lead-free solder that melts during plasticization, and metal powder or a mixture of metal powder and metal short fibers that assists the fine dispersion of particles of the lead-free solder within the thermoplastic resin, so that a wiring path is formed in the frame.

Preferably, a part is mounted on the frame in advance.

More preferably, spaces for receiving the leads of the part are formed in the frame, and the wiring paths are formed in the spaces.

Alternatively, a plurality pf frames are prepared, spaces for receiving the leads of the part are formed in each of the frames, the plurality of frames are joined together such that the spaces of each frame correspond to the spaces of an adjacent frame, and the wiring paths are formed in the spaces.

DESCRIPTION OF THE PREFERRED EMBODIMENTS

Figure 1:
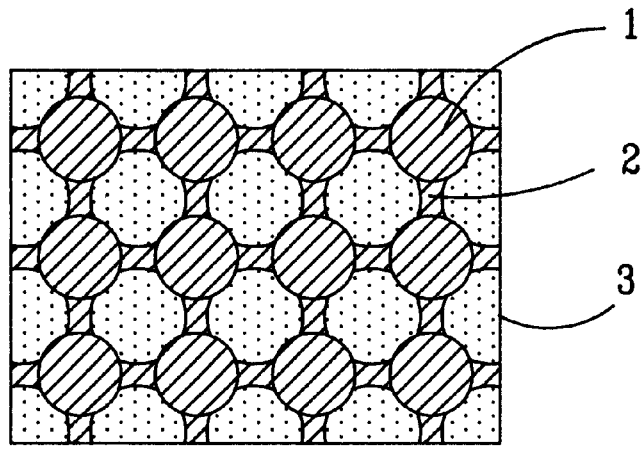
FIG. 1 is a schematic diagram showing the structure of a lead-free super-highly conductive plastic according to the present invention.

Embodiments of the present invention will next be described in detail with reference to the drawings.

No restriction is imposed on synthetic resins used in the present invention, and any one of resins commonly used can be used. However, thermoplastic resin is preferably used from the viewpoint of formability and other required physical properties.

Metal used in the present invention must not contain lead, and must be able to attain a semi-melted state when a synthetic resin composition containing the metal plasticizes thermally. Since the plasticization temperature of thermoplastic resins is usually 350° C. or less, a low-meting-point metal having a melting point lower than 350° C. is preferable.

The metal may be pure metal or alloy. Since the metal is kneaded in a semi-melted state, no limitation is imposed on the shape of the metal. However, a granular or powder shape is desirable from the viewpoint of easiness in dispersing the metal.

Specific examples of the metal usable in the present invention include zinc (Zn), tin (Sn), bismuth (Bi), aluminum (Al), cadmium (Cd), indium (In), and alloys of these metals.

Examples of preferred alloys include low-melting-point alloys such as Sn—Cu, Sn—Zn, Sn—Al, and Sn—Ag.

Examples of metal powder which can promote dispersion of solder include copper (Cu), nickel (Ni), aluminum (Al), chromium (Cr), and powder of alloys of these metals. The smaller the grain size of the metal powder, the more finely the solder can be dispersed. However, the grain size is not required to be uniform, and metal powder having a distribution in grain size can be used.

In the present invention, the metallic component is used in an amount of 30 to 75 vol. %, preferably 45 to 65 vol. %, with respect to the total volume of the conductive resin composition.

The lead-free super-highly conducive plastic of the present invention utilizes a resin and a lead-free solder (low-melting-point alloy that contains no lead), in consideration of environmental protection. When the resin and the solder are kneaded in a state that the solder is semi-melted, particles of the lead-free solder—which is a metallic component—can be finely dispersed within the resin. Further, since the kneading is carried out in the semi-melted state, the dispersed particles of the solder are connected with one another in an unbroken manner. The connection between the dispersed particles of the solder is not mere contact, but solder joint; i.e., conductivity is not attained by mere contact between metal particles. Therefore, even when a molded member is subjected to a high temperatures atmosphere, the joint between the particles is not broken, so that a low resistance is obtained stably.

When the conductive resin composition of the present invention is used for injection molding, the resin composition can be injection-molded into a narrow-width shape even though the content of the metallic component is high. This is because, during the molding, a part of the metallic component is in a semi-melted state, and the lead-free solder is dispersed finely. Therefore, conductive circuits can be formed through a mere injection molding process. Further, since plating is not required, conductive circuits having a low resistance can be formed within an injection-molded member.

The conductive resin composition of the present invention can be manufactured by making use of a kneader and an extruder, which are generally used for resin molding.

Next, the present invention will be described by way of example.

EXAMPLE 1

40 vol. % of lead-free solder (Sn—Cu—Ni—AtW—150, product of Fukuda Metal Foil & Powder Co., Ltd.) and 15 vol. % of copper powder (FCC-SP-77, average grain size: 10 μm, product of Fukuda Metal Foil & Powder Co., Ltd.) were added into 45 vol. % of ABS resin (Toyolac 441, product of Toray Industries) and mixed lightly. Subsequently, the mixture was placed into a kneader (two-axis pressurized type, product of Moriyama Mfg. Works, Ltd.) set at 220° C., and kneaded at a rotational speed of 25 to 50 rpm for 20 minutes, without heating and temperature-maintaining process. Thus, the resin was plasticized, and the solder was dispersed throughout the resin in a semi-melted state.

The kneaded material was subjected to pelletization at a die temperature of 200 to 240° C. through use of a plunger extrusion pelletizer (Model TP60-2, product of Toshin Co., Ltd.). Thus, pellets of the kneaded material were prepared.

The kneaded material in the form of pellets was loaded into an injection molding machine (Model KS-10B, product of Kawaguchi, Ltd.) whose temperature was set at 230 to 280° C. and, was injected into a die (die temperature: room temperature to 150° C.).

The thus-injected molded product did not cause separation of metal particles and had a uniform surface.

The state of dispersion of the solder in the molded product was examined through use of an optical microscope, and particles of the solder having a diameter of approximately 5 $\mu$m were found to be dispersed uniformly throughout the resin. The volumetric resistivity of this sample was on the order of $10^{-5} \Omega \cdot cm$

EXAMPLE 2

40 vol. % of lead-free solder (Sn—Cu—Ni—AtW—150, product of Fukuda Metal Foil & Powder Co., Ltd.) and 15 vol. % of copper powder (FCC-SP-77, average grain size: 10 $\mu$m, product of Fukuda Metal Foil & Powder Co., Ltd.) were added into 45 vol. % of PBT resin (product of Polyplastics Co., Ltd.) and mixed lightly. Subsequently, the mixture was placed into a kneader (two-axis pressurized type, product of Moriyama Mfg. Works, Ltd.) set at 220° C., and kneaded at a rotational speed of 25 to 50 rpm for 20 minutes, without heating and temperature-maintaining process. During this kneading, the temperature of the kneaded material was control not to exceed 235° C. through reduction of the rotational speed, cooling, or other measures. Thus, the resin was plasticized, and the solder was dispersed throughout the resin in a semi-melted state. The state of dispersion of the solder in the kneaded material was examined through use of an optical microscope, and particles of the solder having a diameter of approximately 5 $\mu$m were found to be dispersed uniformly throughout the resin.

EXAMPLE 3

55 vol. % of lead-free solder (Sn—Cu—Ni—AtW—150, product of Fukuda Metal Foil & Powder Co., Ltd.) and 10 vol. % of copper powder (FCC-SP-77, average grain size: 10 $\mu$m, product of Fukuda Metal Foil & Powder Co., Ltd.) were added into 35 vol. % of ABS resin (Toyolac 441, product of Toray Industries) and mixed lightly. Thus, the total content of the metallic components was set to 65 vol. %. Subsequently, the mixture was placed into a kneader (two-axis pressurized type, product of Moriyama Mfg. Works, Ltd.) set at 220° C., and kneaded at a rotational speed of 25 to 50 rpm for 20 minutes, without heating and temperature-maintaining process. Thus, the resin was plasticized, and the solder was dispersed throughout the resin in a semi-melted state.

The kneaded material was subjected to pelletization at a die temperature of 200 to 240° C. through use of a plunger extrusion pelletizer (Model TP60-2, product of Toshin Co., Ltd.). Thus, pellets of the kneaded material were prepared. The kneaded material in the form of pellets was loaded into an injection molding machine (Model KS-10B, product of Kawaguchi Ltd.) whose temperature was set at 230 to 280° C. and, was injected into a die (die temperature: room temperature to 150° C.).

The thus-injected molded product did not cause separation of metal particles and had a uniform surface.

The state of dispersion of the solder in the molded product was examined through use of an optical microscope, and particles of the solder having a diameter of approximately 100 $\mu$m or less were found to be dispersed uniformly throughout the resin. The volumetric resistivity of this sample was on the order of $4 \times 10^{-5} \Omega \cdot cm$ As is apparent from the above-described specific examples, particles of the lead-free solder was able to be dispersed finely throughout the resin. In addition, even when the metallic component was mixed in an amount as much as 65 vol. %, there was able to be obtained a kneaded material that did not cause separation of metal particles from the resin during heating.

In the lead-free super-highly conductive plastic, since particles of solder were connected with each other, the conductivity did not deteriorate even at high temperatures. Therefore, the lead-free super-highly conductive plastic exhibited stable high conductivity, and was able to be injection-molded into a narrow-width shape without causing clogging.

Use of the lead-free super-highly conductive plastic has enabled the formation of a three-dimensional conductive circuit having a low resistance through injection molding.

Next, specific examples will be described in detail with reference to the drawings.

FIG. 1 is a schematic diagram showing the structure of a lead-free super-highly conductive plastic according to the present invention.

As shown in FIG. 1, in the lead-free super-highly conductive plastic according to the present invention, since particles of lead-free solder 1 are connected with each other via solder 2 melted within plastic 3, the particles of lead-free solder 1 are mutually joined, so that high conductivity and high connection reliability are attained.

Figure 2:
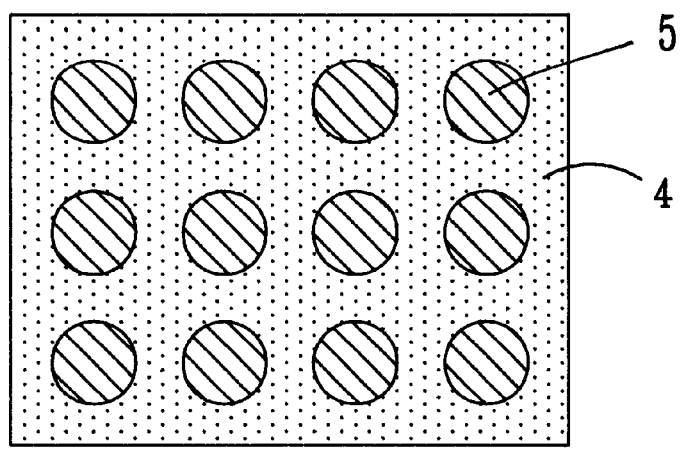
FIG. 2 is a schematic diagram showing the structure of a conventional conductive plastic manufactured through kneading of a resin and an unmeltable metal powder.

By contrast, as shown in FIG. 2, when conventional unmeltable metal powder 5 is kneaded with plastic 4, particles of the metal are not connected and therefore sufficient conductivity cannot be obtained unless the amount of the metal powder 5 is increased.

Figure 3A:
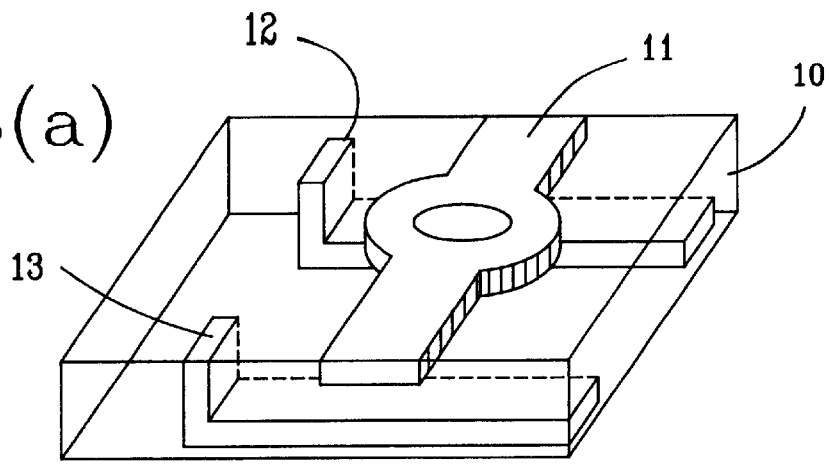
FIGS. 3(a) and 3(b) are views showing the steps of forming a conductive circuit through use of the lead-free super-highly conductive plastic according to the present invention.
Figure 3B:
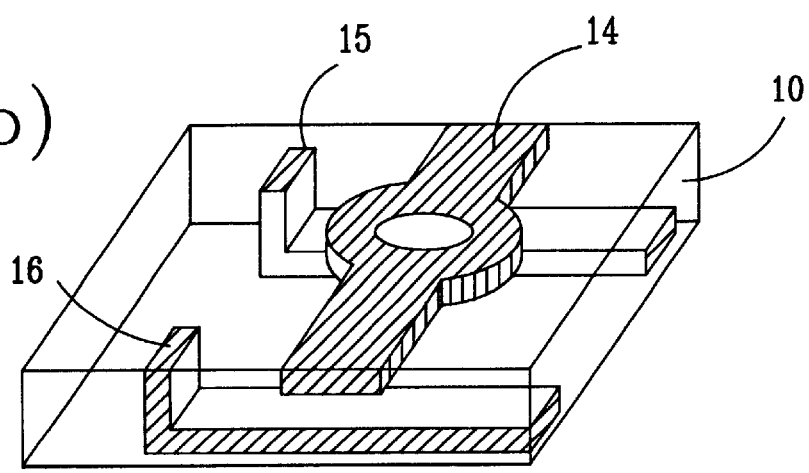

FIGS. 3(a) and 3(b) are views showing the steps of forming a conductive circuit through use of the lead-free super-highly conductive plastic according to the present invention.

(1) First, a die (not shown) is set, and, as shown in FIG. 3(a) a plastic frame (injection-molded member) 10 is molded through use of an ordinary injecting molding machine such that the frame has desired spaces 11, 12, and 13 which will finally become designed wiring paths.

(2) Subsequently, as shown in FIG. 3(b), the lead-free super-highly conductive plastic of the present invention is injected into the spaces 11, 12, and 13 to form the wiring paths (conductive circuits) 14, 15, and 16.

The plastic frame 10 can be functioned as a substrate, case, cover, or housing, depending on the molded shape.

The shape of the conductive circuit can be designed freely. For example, the width and thickness of the conductive circuit can be changed locally. Further, the conductive circuit may be formed to have a pin-like shape or a terminal-like shape.

Figure 4:
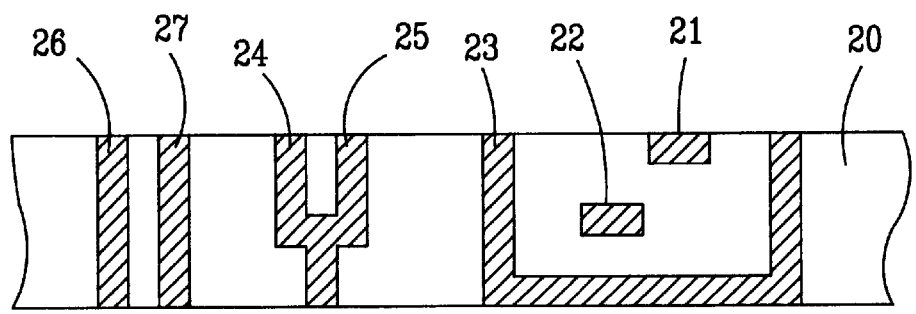
FIG. 4 is a sectional view showing examples of the conductive circuit formed of the lead-free super-highly conductive plastic according to the present invention.

Further, as shown in FIG. 4, there can be formed within a frame 20 a plurality of layered wiring paths (conductive circuits) 21, 22, and 23, branched wiring paths (branched circuit) 24 and 25, and wiring paths (conductive circuits) 26 and 27 that extend between opposite surfaces.

The wiring paths (conductive circuits) may be disposed at the surface of the frame, within the frame, or through the frame to connect the opposite surfaces of the frame.

As described above, the conductive circuits can be disposed freely. Especially, the conductive circuits according to the present invention are advantageously applied to a circuit board that constitutes a communication circuit, because such a circuit board includes many kinds of circuits (signal line, power supply line, ground line, etc.) in the form of a multi-layer wiring circuit.

Figure 5:
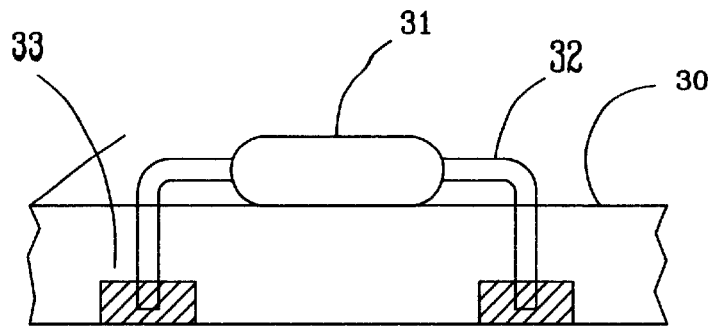
FIG. 5 is a sectional view showing a first example in which the lead-free super-highly conductive plastic according to the present invention is used for connection with an electric/electronic component.

FIG. 5 is a sectional view showing a first example in which the lead-free super-highly conductive plastic according to the present invention is used for connection with an electric/electronic component.

As shown in FIG. 5, in the present example, an electric or electronic component 31 is mounted on the surface of a frame 30 such that lead terminals 32 of the component 31 extend into the frame 30 and reach to positions in the vicinity of the back surface of the frame 30. Spaces are formed in the back surface such that the spaces surround the tip ends of the lead terminals 32. The lead-free super-highly conductive plastic of the present invention is injected into the spaces in order to form wiring paths 33 for connection with the electric or electronic component 31.

As described above, in the present example, the electric or electronic component 31 can be disposed outside the frame, while the wiring paths 33 can be formed inside the frame.

Figure 6:
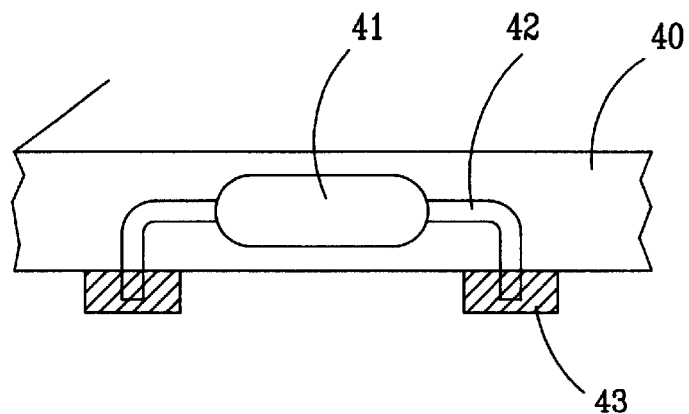
FIG. 6 is a sectional view showing a second example in which the lead-free super-highly conductive plastic according to the present invention is used for connection with an electric/electronic component.

FIG. 6 is a sectional view showing a second example in which the lead-free super-highly conductive plastic according to the present invention is used for connection with an electric/electronic component.

As shown in FIG. 6, in the present example, an electric or electronic component 41 is mounted within a frame 40 such that lead terminals 42 of the component 41 project outward from the back surface of the frame 40. The lead-free super-highly conductive plastic of the present invention is injected such that the conductive plastic surrounds the tip ends of the lead terminals 42 in order to form wiring paths 43 for connection with the electric or electronic component 41.

As described above, in the present example, the electric or electronic component 41 can be disposed inside the frame, while the wiring paths 43 can be formed outside the frame.

Figure 7:
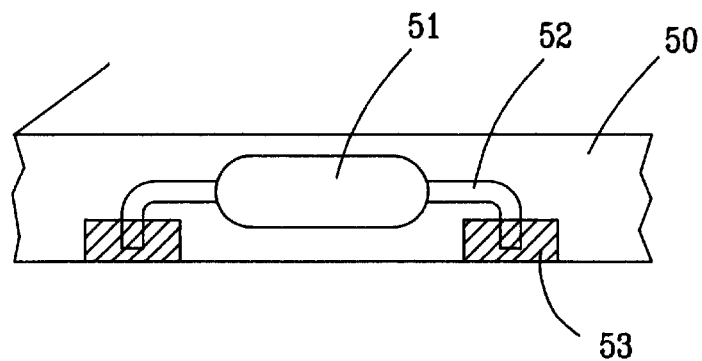
FIG. 7 is a sectional view showing a third example in which the lead-free super-highly conductive plastic according to the present invention is used for connection with an electric/electronic component.

FIG. 7 is a sectional view showing a third example in which the lead-free super-highly conductive plastic according to the present invention is used for connection with an electric/electronic component.

As shown in FIG. 7, in the present example, an electric or electronic component 51 is mounted within a frame 50 such that lead terminals 52 of the component 51 extend to positions in the vicinity of the back surface of the frame 50 but do not project from the back surface. Spaces are formed in the back surface such that the spaces surround the tip ends of the lead terminals 52. The lead-free super-highly conductive plastic of the present invention is injected into the spaces in order to form wiring paths 53 for connection with the electric or electronic component 51.

As described above, in the present example, both of the electric or electronic component 51 and the wiring paths 53 can be formed inside the frame.

When a circuit component is set within a die before formation of an conductive circuit through injection molding, the conductive circuit and the component can be connected by a single injection molding process, so that the process of forming the circuit can be simplified.

Figure 8:
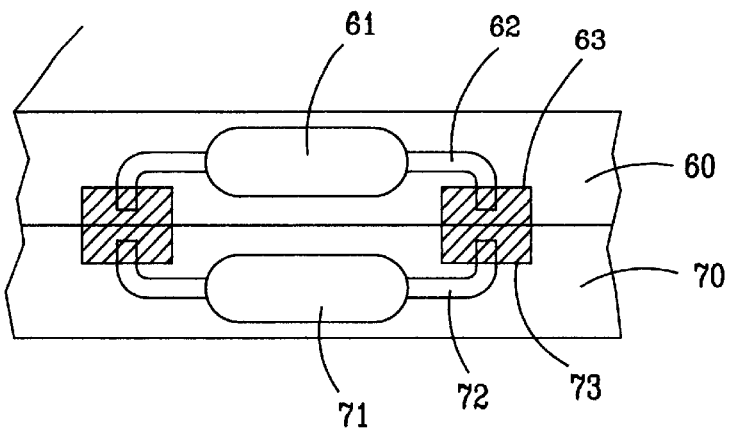
FIG. 8 is a sectional view showing a fourth example in which the lead-free super-highly conductive plastic according to the present invention is used for connection with an electric/electronic component.

FIG. 8 is a sectional view showing a fourth example in which the lead-free super-highly conductive plastic according to the present invention is used for connection with an electric/electronic component.

Like the third example that has been described with reference to FIG. 7, electric or electronic component 61 and 71 are mounted within respective frames 60 and 70 such that lead terminals 62 and 72 of the components 61 and 72 extend to positions in the vicinity of the back surfaces of the frames 60 and 70 but do not project from the back surfaces. Spaces are formed in the back surfaces such that the spaces surround the tip ends of the lead terminals 62 and 72.

The frames 60 and 70 are then joined together such that the spaces of the frame 60 face or correspond to the spaces of the frame 70. Subsequently, the lead-free super-highly conductive plastic of the present invention is injected into the spaces. Thus, the wiring paths 63 of the frame 60 on which the electric or electronic component 61 is mounted are connected with the wiring paths 73 of the frame 70 on which the electric or electronic component 71 is mounted, so that an electric/electronic component module can be fabricated.

The above-described structure enables the formation of circuits through simultaneous molding of two frames.

Figure 9:
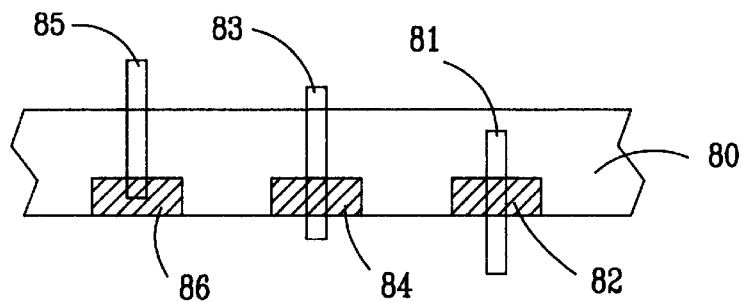
FIG. 9 is a sectional view showing an example in which the lead-free super-highly conductive plastic according to the present invention is used for pin connection.

FIG. 9 is a sectional view showing an example in which the lead-free super-highly conductive plastic according to the present invention is used for pin connection.

As shown in FIG. 9, a pin 81 is embedded in a frame 80 such that it projects from the back surface of the frame 80, and a space surrounding the pin 81 is formed in the back surface of the frame 80. Alternatively or additionally, a pin 83 is embedded in the frame 80 such that it projects from both of the opposite surfaces of the frame 80, and a space surrounding the pin 81 is formed in the back surface of the frame 80. Alternatively or additionally, a pin 85 is embedded in the frame 80 such that it projects from the top surface of the frame 80 and extends to a point near the back surface, and a space surrounding the pin 81 is formed in the back surface of the frame 80.

The lead-free super-highly conductive plastic of the present invention is injected into the spaces. Thus, wiring paths 82, 84, and 86 connected to the respective pins can be formed concurrently.

Examples of the pins include lead pins, such as those of IC sockets.

Figure 10:
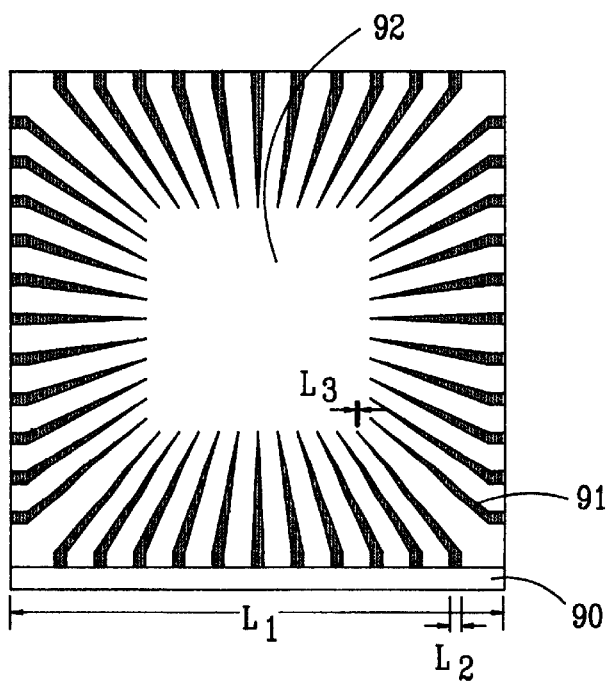
FIG. 10 is a diagram showing lead wires of a package substrate for a surface-mount type chip component, to which the method of forming a conductive circuit of the present invention is applied.

FIG. 10 is a diagram showing lead terminals of a package substrate for a surface-mount type chip component, to which the method of forming a conductive circuit of the present invention is applied.

As shown in FIG. 10, in the present example, a substrate (corresponding to a frame or injection-molded member) 90 is formed through use of plastic. Spaces corresponding to the circuit patterns are formed in the surface of the substrate, and the lead-free super-highly conductive plastic of the present invention is injected into the spaces. Thus, lead wires 91 are formed. Numeral 92 denotes an area in which a surface-mount type chip (LSI or IC) is mounted. The substrate can be formed such that the dimension L1 of the substrate is 50 mm, the dimension L2 of the lead wire at the outer end is 1 mm, and the dimension L3 of the lead wire at the inner end is 0.5 m.

As described above, the present invention facilitates the formation of lead wires of a package for a surface-mount type chip.

The present invention is not limited to the above-described embodiments. Numerous modifications and variations of the present invention are possible in light of the spirit of the present invention, and they are not excluded from the scope of the present invention.

The present invention provides the following advantages:

(1) There can be provided a super-highly conductive plastic which has a low resistance, whose conductivity does not decrease in various environments and which is therefore highly reliable.

That is, the present invention utilizes a resin and a lead-free solder (low-melting-point alloy that contains no lead), in consideration of environmental protection. When the resin and the solder are kneaded in a state that the solder is semi-melted, particles of the lead-free solder—which is a metallic component—can be finely dispersed within the resin. Further, since the kneading is carried out in the semi-melted state, the dispersed particles of the solder are connected with one another in an unbroken manner. The connection between the dispersed particles of the solder is not mere contact, but solder joint; i.e., conductivity is not attained by mere contact between metal particles. Therefore, even when a molded component is subjected to a high temperatures atmosphere, the joint between the particles is not broken, so that a low resistance is obtained stably.

(2) When the conductive resin composition of the present invention is used for injection molding, the resin composition can be injection-molded into a narrow-width shape even though the content of the metallic component is high. This is because, during the molding, a part of the metallic component is in a semi-melted state, and the lead-free solder is dispersed finely. Therefore, conductive circuits can be formed through a mere injection molding process. Further, since plating is not required, conductive circuits having a low resistance can be formed within a frame (inject-molded substrate).

What is claimed is:

1. A conductive plastic in the form of pellets suitable for use as a feed for an injection molding machine for fabricating conductive elements by injection molding, the conductive plastic being formed of a conductive resin composition comprising:

(a) a thermoplastic resin having a plasticization temperature;

(b) a particulate lead-free solder having a melting point lower than the plasticization temperature, the lead-free solder forming a semi-melted state during plasticization of said thermoplastic resin; and (c) metal powder or a mixture of metal powder and metal short fibers, different from said solder, having a melting point higher than the plasticization temperature and assisting the fine dispersion of particles of the lead-free solder within the thermoplastic resin, wherein said conductive plastic is formed by kneading an admixture of said components (a), (b) and (c), at a temperature at which said thermoplastic resin is plasticized and said solder is semi-melted, to form soldered joints between adjacent particles of said solder, and pelletizing the kneaded admixture in a pelletizer to form said pellets.

2. A conductive plastic according to claim 1 wherein said particulate lead-free solder is an alloy selected from the group consisting of Sn—Cu, Sn—Zn, Sn—Al and Sn—Ag and said metal powder is a powder of a metal selected from the group consisting of copper, nickel, aluminum, chromium and alloys thereof.

3. A conductive plastic according to claim 1, wherein particles of the lead-free solder are dispersed such that the particles of the lead-free solder are in unbroken connection throughout the thermoplastic resin.

4. A conductive plastic according to claim 1, wherein the conductive resin composition has a volumetric resistivity of $10^{-4}$ ohm·cm or less.

5. A conductive circuit including a wiring path that is formed in an insulating member through injection molding of the conductive resin composition of claim 1.

6. A conductive circuit according to claim 5, wherein the wiring path establishes connection between components.

7. A conductive circuit according to claim 5, wherein the wiring path establishes connection with a mounted component.

8. A conductive circuit according to claim 5, wherein the wiring path establishes connection with an electronic part.

* * * * *